(12) United States Patent
Wei et al.

(10) Patent No.: US 7,544,999 B2
(45) Date of Patent: Jun. 9, 2009

(54) SOI SEMICONDUCTOR DEVICE HAVING ENHANCED, SELF-ALIGNED DIELECTRIC REGIONS IN THE BULK SILICON SUBSTRATE

(75) Inventors: Andy C. Wei, Radebeul/Dresden (DE); Derick J. Wristers, Bee Caves, TX (US); Mark B. Fuselier, Austin, TX (US)

(73) Assignee: Advanced Micro Devices, Inc., Austin, TX (US)

( * ) Notice: Subject to any disclaimer, the term of this patent is extended or adjusted under 35 U.S.C. 154(b) by 757 days.

(21) Appl. No.: 11/072,661

(22) Filed: Mar. 4, 2005

(65) Prior Publication Data

US 2005/0151133 A1 Jul. 14, 2005

Related U.S. Application Data

(62) Division of application No. 10/162,299, filed on Jun. 4, 2002, now Pat. No. 6,884,702.

(51) Int. Cl.
*H01L 27/12* (2006.01)
(52) U.S. Cl. .................. 257/347; 257/349; 257/396; 257/E27.112
(58) Field of Classification Search .......... 257/347, 257/349, 396, E27.112
See application file for complete search history.

(56) References Cited

U.S. PATENT DOCUMENTS

| 5,510,640 | A | 4/1996 | Shindo ........................ 257/347 |
| 5,608,252 | A | 3/1997 | Nakato ........................ 257/347 |
| 6,103,569 | A * | 8/2000 | Teo et al. ..................... 438/253 |
| 6,407,428 | B1 | 6/2002 | Krishnan et al. ............ 257/347 |
| 6,441,436 | B1 * | 8/2002 | Wu et al. ..................... 257/350 |

(Continued)

OTHER PUBLICATIONS

Wolf and Tauber, Silicon Processing, vol. 1, Lattice Press, Sunset Beach, CA, pp. 321-322.

*Primary Examiner*—Matthew E Warren
(74) *Attorney, Agent, or Firm*—Williams, Morgan & Amerson, P.C.

(57) ABSTRACT

In one illustrative embodiment, the method comprises forming a gate electrode above an SOI substrate comprised of a bulk substrate, a buried insulation layer and an active layer, the gate electrode having a protective layer formed thereabove, and forming a plurality of dielectric regions in the bulk substrate after the gate electrode is formed, the dielectric regions being self-aligned with respect to the gate electrode, the dielectric regions having a dielectric constant that is less than a dielectric constant of the bulk substrate. In further embodiments, the method comprises forming a gate electrode above an SOI substrate comprised of a bulk substrate, a buried insulation layer and an active layer, the gate electrode having a protective layer formed thereabove, performing at least one oxygen implant process after the gate electrode and the protective layer are formed to introduce oxygen atoms into the bulk substrate to thereby form a plurality of oxygen-doped regions in the bulk substrate, and performing at least one anneal process to convert the oxygen-doped regions to dielectric regions comprised of silicon dioxide in the bulk substrate. In one illustrative embodiment, the device comprises a gate electrode formed above an SOI structure comprised of a bulk substrate, a buried insulation layer, and an active layer, and a plurality of dielectric regions comprised of silicon dioxide formed in the bulk substrate, the dielectric regions being self-aligned with respect to the gate electrode.

13 Claims, 3 Drawing Sheets

U.S. PATENT DOCUMENTS

| | | | |
|---|---|---|---|
| 2001/0011756 A1 | 8/2001 | Yu | 257/408 |
| 2001/0020722 A1 | 9/2001 | Yang | 257/347 |
| 2002/0063286 A1 | 5/2002 | Wu et al. | 257/347 |

* cited by examiner

SOI SEMICONDUCTOR DEVICE HAVING ENHANCED, SELF-ALIGNED DIELECTRIC REGIONS IN THE BULK SILICON SUBSTRATE

CROSS-REFERENCE TO RELATED APPLICATION

This is a divisional of application Ser. No. 10/162,299, filed Jun. 4, 2002 now U.S. Pat. No. 6,884,702.

BACKGROUND OF THE INVENTION

1. Field of the Invention

This invention relates generally to semiconductor fabrication technology, and, more particularly, to a method of making an SOI semiconductor device having enhanced, self-aligned dielectric regions in the bulk silicon substrate.

2. Description of the Related Art

There is a constant drive within the semiconductor industry to increase the operating speed of integrated circuit devices, e.g., microprocessors, memory devices, and the like. This drive is fueled by consumer demands for computers and electronic devices that operate at increasingly greater speeds. This demand for increased speed has resulted in a continual reduction in the size of semiconductor devices, e.g., transistors. That is, many components of a typical field effect transistor (FET), e.g., channel length, junction depths, gate insulation thickness, and the like, are reduced. For example, all other things being equal, the smaller the channel length of the transistor, the faster the transistor will operate. Thus, there is a constant drive to reduce the size, or scale, of the components of a typical transistor to increase the overall speed of the transistor, as well as integrated circuit devices incorporating such transistors.

As transistors are continually scaled to keep up with the requirements of advancing technology, device reliability dictates an associated reduction in the power supply voltage. Hence, every successive technology generation is often accompanied by a reduction in the operating voltage of the transistor. It is known that transistor devices fabricated on silicon on-insulator (SOI) substrates exhibit better performance at low operating voltages than do transistors of similar dimensions fabricated in bulk silicon substrates. The superior performance of SOI devices at low operating voltage is related to the relatively lower junction capacitances obtained on an SOI device as compared to a bulk silicon device of similar dimensions. The buried oxide layer in an SOI device separates active transistor regions from the bulk silicon substrate, thus reducing junction capacitance.

FIG. 1 depicts an example of an illustrative transistor 10 fabricated on an illustrative silicon-on-insulator substrate 11. As shown therein, the SOI substrate 11 is comprised of a. bulk substrate 11A, a buried insulation layer 11B, and an active layer 11C. The transistor 10 is comprised of a gate insulation layer 14, a gate electrode 16, sidewall spacers 19, a drain region 18A, and an source region 18B. A plurality of trench isolation regions 17 are formed in the active layer 11C. Also depicted in FIG. 1 are a plurality of conductive contacts 20 formed in a layer of insulating material 21. The conductive contacts 20 provide electrical connection to the drain and source regions 18A, 18B. As constructed, the transistor 10 defines a channel region 12 in the active layer 11C beneath the gate insulating layer 14. The bulk substrate 11A is normally doped with an appropriate dopant material, i.e., a P-type dopant such as boron or boron difluoride for NMOS devices, or an N-type dopant such as arsenic or phosphorous for PMOS devices. Typically, the bulk substrate 11A will have a doping concentration level on the order of approximately $10^{15}$ ions/cm$^3$. The buried insulation layer 11B may be comprised of silicon dioxide, and it may have a thickness of approximately 50-360 nm (500-3600 Å). The active layer 11C may be comprised of a doped silicon, and it may have a thickness of approximately 5-30 nm (50-300 Å).

Transistors fabricated in SOI substrates offer several performance advantages over transistors fabricated in bulk silicon substrates. For example, complementary-metal-oxide-semiconductor (CMOS) devices fabricated in SOI substrates are less prone to disabling capacitive coupling, known as latch-up. In addition, transistors fabricated in SOI substrates, in general, have large drive currents and high transconductance values. Also, the sub-micron SOI transistors have improved immunity to short-channel effects when compared with bulk transistors fabricated to similar dimensions.

Although SOI devices offer performance advantages over bulk silicon devices of similar dimensions, SOI devices share certain performance problems common to all thin-film transistors. For example, the active elements of an SOI transistor are fabricated in the thin-film active layer 11C. Scaling of thin-film transistors to smaller dimensions requires that the thickness of the active layer 11C be reduced. However, as the thickness of the active layer 11C is reduced, the electrical resistance of the active layer 11C correspondingly increases. This can have a negative impact on transistor performance because the fabrication of transistor elements in a conductive body having a high electrical resistance reduces the drive current of the transistor 10. Moreover, as the thickness of the active layer 11C of an SOI device continues to decrease, variations in the threshold voltage ($V_T$) of the device occur. In short, as the thickness of the active layer 11C decreases, the threshold voltage of the device becomes unstable. As a result, use of such unstable devices in modern integrated circuit devices, e.g., microprocessors, memory devices, logic devices, etc., becomes very difficult if not impossible.

Additionally, off-state leakage currents are always of concern in integrated circuit design, since such currents tend to, among other things, increase power consumption. Such increased power consumption is particularly undesirable in many modern portable consumer devices employing integrated circuits, e.g., portable computers. Lastly, as device dimensions continue to decrease in fully depleted SOI structures, increased short channel effects may occur. That is, in such fully depleted devices, at least some of the field lines of the electric field of the drain 18A tend to couple to the channel region 12 of the transistor 10 through the relatively thick (200-360 nm) buried insulation layer 11B. In some cases, the electric field of the drain 18A may act to, in effect, turn on the transistor 10. Theoretically, such problems may be reduced by reducing the thickness of the buried insulation layer 11B and/or increasing the doping concentration of the bulk substrate 11A. However, such actions, if taken, would tend to increase the junction capacitance between the drain and source regions 18A, 18B and the bulk substrate 11A, thereby negating one of the primary benefits of SOI technology, i.e., reducing such junction capacitance.

The present invention is directed to a device that may solve, or at least reduce, some or all of the aforementioned problems, and a method of making such a device.

SUMMARY OF THE INVENTION

The present invention is generally directed to a method of making an SOI semiconductor device having enhanced, self-aligned dielectric regions in the bulk silicon substrate. In one illustrative embodiment, the method comprises forming a gate electrode above an SOI substrate comprised of a bulk substrate, a buried insulation layer and an active layer, the gate electrode having a protective layer formed thereabove, and forming a plurality of dielectric regions in the bulk substrate after the gate electrode is formed, the dielectric regions being self-aligned with respect to the gate electrode, the dielectric regions having a dielectric constant that is less than a dielectric constant of the bulk substrate. In a further embodiment, the method comprises forming a gate electrode above an SOI substrate comprised of a bulk substrate, a buried insulation layer and an active layer, the gate electrode having a protective layer formed thereabove, performing at least one oxygen implant process after the gate electrode and the protective layer are formed to introduce oxygen atoms into the bulk substrate to thereby form a plurality of oxygen-doped regions in the bulk substrate, and performing at least one anneal process to convert the oxygen-doped regions to dielectric regions comprised of silicon dioxide in the bulk substrate.

In one illustrative embodiment, the device comprises a gate electrode formed above an SOI structure comprised of a bulk substrate, a buried insulation layer, and an active layer, and a plurality of dielectric regions formed in the bulk substrate, the dielectric regions being self-aligned with respect to the gate electrode and having a dielectric constant that is less than that of the bulk substrate. In further embodiments, the dielectric regions are comprised of silicon dioxide.

BRIEF DESCRIPTION OF THE DRAWINGS

The invention may be understood by reference to the following description taken in conjunction with the accompanying drawings, in which like reference numerals identify like elements, and in which.

Figure 1:
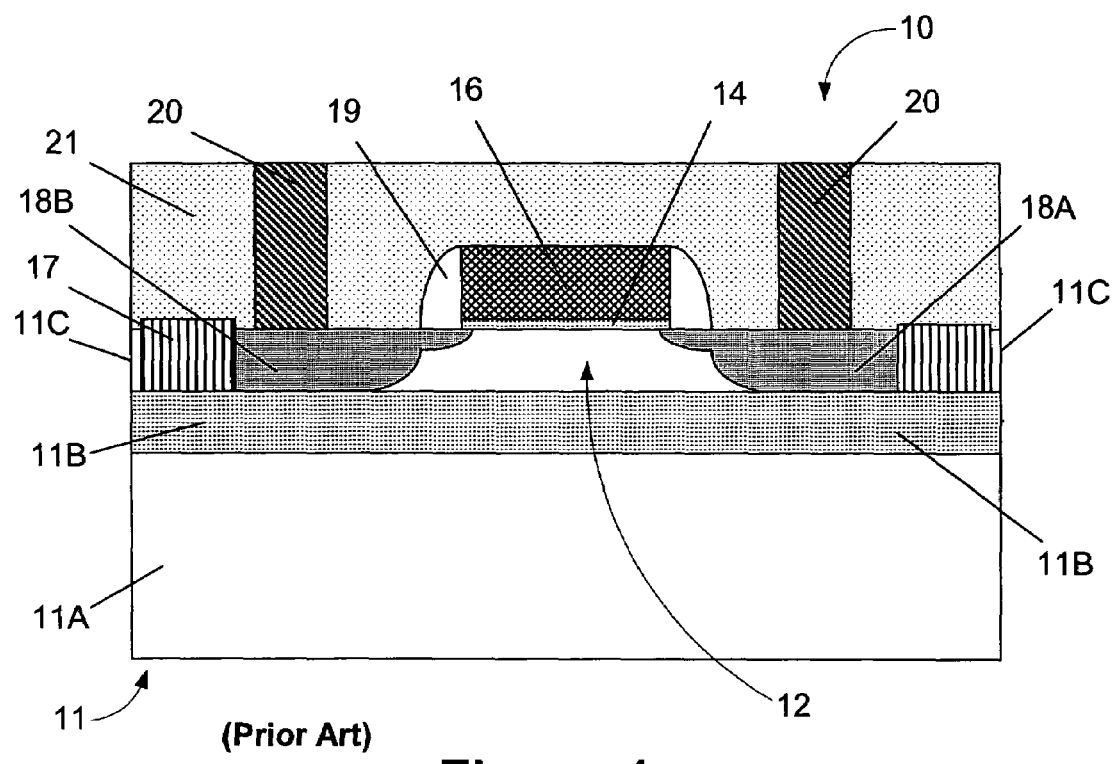
FIG. 1 is a cross-sectional view of an illustrative prior art semiconductor device formed above an SOI substrate.

While the invention is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION OF THE INVENTION

Illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present invention will now be described with reference to the attached figures. Although the various regions and structures of a semiconductor device are depicted in the drawings as having very precise, sharp configurations and profiles, those skilled in the art recognize that, in reality, these regions and structures are not as precise as indicated in the drawings. Additionally, the relative sizes of the various features and doped regions depicted in the drawings may be exaggerated or reduced as compared to the size of those features or regions on fabricated devices. Nevertheless, the attached drawings are included to describe and explain illustrative examples of the present invention. The words and phrases used herein should be understood and interpreted to have a meaning consistent with the understanding of those words and phrases by those skilled in the relevant art. No special definition of a term or phrase, i.e., a definition that is different from the ordinary and customary meaning as understood by those skilled in the art, is intended to be implied by consistent usage of the term or phrase herein. To the extent that a term or phrase is intended to have a special meaning, i.e., a meaning other than that understood by skilled artisans, such a special definition will be expressly set forth in the specification in a definitional manner that directly and unequivocally provides the special definition for the term or phrase.

In general, the present invention is directed to a method of making an SOI semiconductor device having enhanced, self-aligned dielectric regions in the bulk silicon substrate. Although the present invention will be initially disclosed in the context of the formation of an illustrative NMOS transistor, those skilled in the art will understand after a complete reading of the present application that the present invention is not so limited. More particularly, the present invention may be employed with respect to a variety of technologies, e.g., NMOS, PMOS, CMOS, etc., and it may be employed with a variety of different type devices, e.g., memory devices, microprocessors, logic devices, etc.

Figure 2:
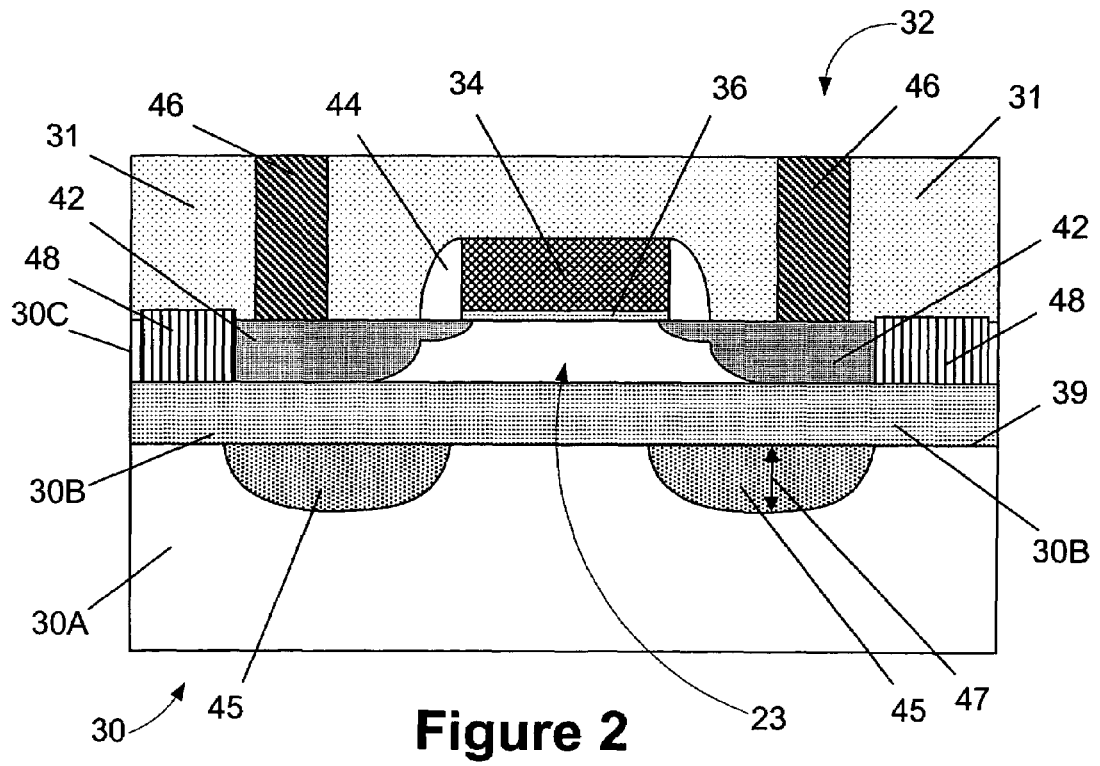
FIG. 2 is a cross-sectional view of a semiconductor device in accordance with one illustrative embodiment of the present invention.

FIG. 2 depicts an illustrative NMOS transistor 32 formed in accordance with one embodiment of the present invention. As shown therein, the transistor 32 is formed above an SOI substrate 30. In one illustrative embodiment, the SOI substrate 30 is comprised of a bulk substrate 30A, a buried insulation layer 30B, and an active layer 30C. Of course, FIG. 2 only depicts a small portion of an entire substrate or wafer. In the illustrative embodiment where an NMOS device is formed, the bulk substrate 30A may be doped with a P-type dopant material, e.g., boron, boron difluoride, etc., and it my have a dopant concentration of approximately $10^{15}$ ions/cm$^3$. The buried insulation layer 30B may have a thickness that, in one embodiment, varies from approximately 5-50 nm (50-500 Å), and it may be comprised of, for example, silicon dioxide. The active layer 30C may have a thickness that varies from approximately 5-30 nm (50-300 Å), and, in the case of an NMOS device, it may be doped with a P-type dopant material. However, the recited details of the construction of the SOI substrate 30 should not be considered a limitation of the present invention unless such limitations are specifically set forth in the appended claims.

As shown in FIG. 2, the transistor 32 is comprised of a gate insulation layer 36, a gate electrode 34, sidewall spacers 44 and source/drain regions 42. Also depicted in FIG. 2 are isolation regions 48 formed in the active layer 30C and a plurality of conductive contacts 46 formed in a layer of insulating material 31. As will be recognized by those skilled in the art, the contacts 46 provide a means for establishing electrical contact with the source/drain regions 42 of the transistor 32.

According to the present invention, a plurality of dielectric regions 45 are formed in the bulk substrate 30A under the area occupied by the source/drain regions 42. As will be understood after a complete reading of the present application, the dielectric regions 45 are self-aligned with respect to the gate electrode 34, as will be described more fully later in the application. The dielectric regions 45 may be comprised of a variety of materials and they may be formed by a variety of techniques. In one illustrative embodiment, the dielectric regions 45 have a depth 47 beneath the surface 39 of the bulk substrate 30A that ranges from approximately 10-200 nm, and they are comprised of silicon dioxide.

Figure 3A:
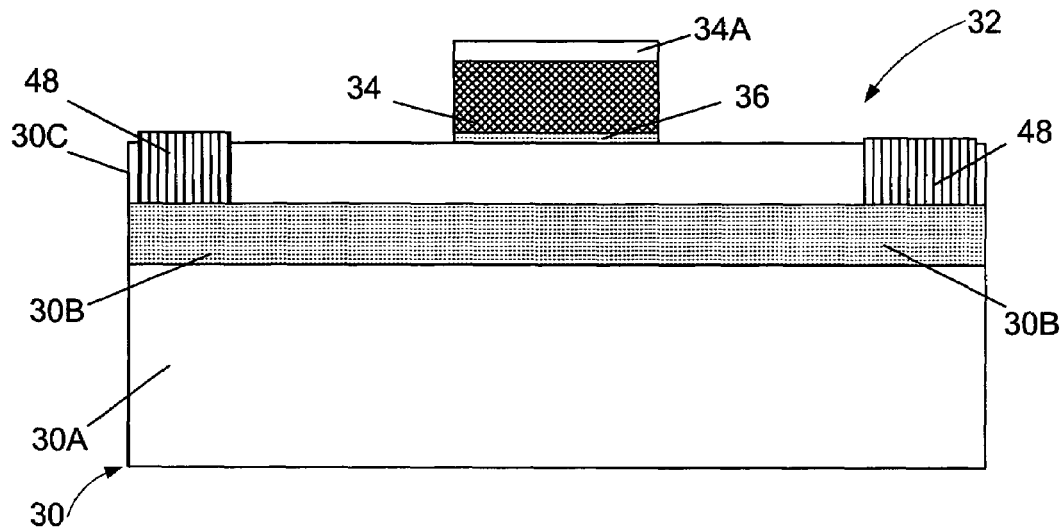
FIGS. 3A-3C are cross-sectional views depicting one illustrative method of the present invention for forming an illustrative semiconductor device above an SOI substrate.
Figure 3B:
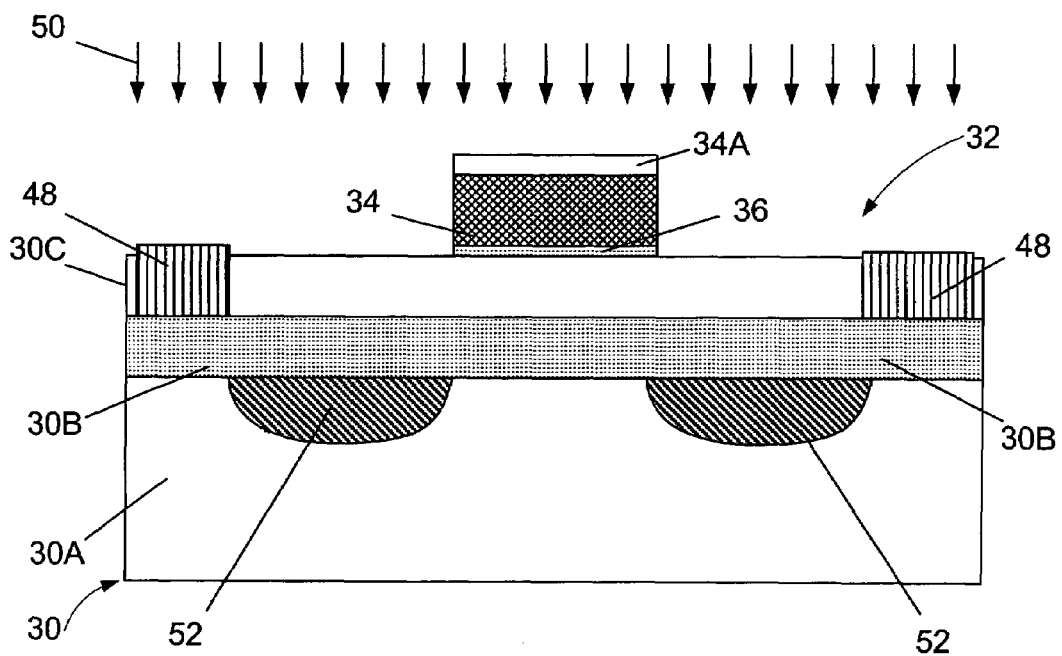
Figure 3C:
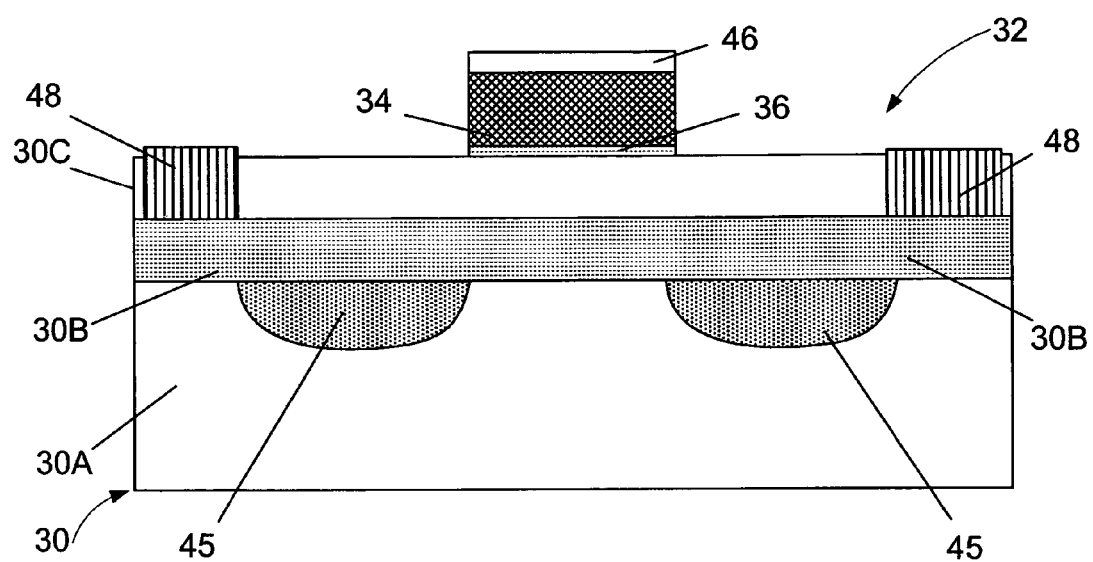

FIGS. 3A-3C depict one illustrative embodiment of a method that may be used to form the semiconductor device described herein. FIG. 3A depicts the device at the stage of fabrication where the trench isolation regions 48 have been formed in the active layer 30C, and the gate insulation layer 36 and gate electrode 34 have been formed above the active layer 30C. Also depicted in FIG. 3A is a protective layer 34A formed above the gate electrode 34. The protective layer 34A will be used to protect the gate electrode 34 during a subsequent oxygen implant process to be described in greater detail below.

The trench isolation regions 48, gate insulation layer 36 and gate electrode 34 may be comprised of a variety of different materials, and these components may be formed by a variety of known techniques. For example, the gate insulation layer 36 may be comprised of a thermally-grown layer of silicon dioxide. The gate electrode 34 may be comprised of a doped polysilicon or a metal. The gate electrode 34 may be formed by depositing a layer of material, e.g., polysilicon, and performing one or more etching processes on the deposited layer of material to thereby define the gate electrode 34. The protective layer 34A may be a permanent part of the completed device, or it may be sacrificial in nature, i.e., it may be removed after the oxygen implant process described below is performed. The protective layer 34A may also be used for other processes, e.g., it may also act as an anti-reflective coating layer that is formed above a layer of polysilicon to reduce reflection during stepper exposure processes used to form a patterned layer of photoresist above the layer of polysilicon. In general, the protective layer 34A may be comprised of a variety of materials, e.g., silicon nitride, silicon oxynitride, an oxide, polyimide, an organic anti-reflective coating layer, etc., and it may have a thickness that ranges from approximately 20-300 nm. The protective layer 34A may be formed by a variety of techniques, e.g., by a chemical vapor deposition process.

Next, as shown in FIG. 3B, after the gate electrode 34 is formed, an ion implant process, as indicated by arrows 50, is performed to implant oxygen atoms into the bulk substrate 30A. This implant process 50 is self-aligned with respect to the gate electrode 34 and the trench isolation regions 48. The implant process 50 may be performed using a dose of approximately $1e^{17}$-$5e^{18}$ ions/cm$^2$ of oxygen at an energy level ranging from approximately 10-100 keV. This will result in the formation of a plurality of oxygen-doped regions 52 in the bulk substrate 30A. The oxygen implant process 50 may be performed at any time after the gate electrode 34 is formed.

The structure shown in FIG. 3C is depicted at the point in processing where at least one anneal process has been performed to convert the oxygen-doped regions 52 (see FIG. 3B) to silicon dioxide dielectric regions 45. In one embodiment, the anneal process is performed at a temperature ranging from approximately 1100-1400° C. for a duration of approximately 1-6 hours. The anneal process may be performed in a traditional furnace. Given that an anneal process will be performed to form the silicon dioxide dielectric regions 45, it may be desirable that the anneal process be performed prior to forming at least some of the other doped regions for the device, e.g., the source/drain regions 42. Thereafter, traditional semiconductor manufacturing operations are performed to complete the formation of the transistor 32 depicted in FIG. 2. That is, the sidewall spacers 44, source/drain regions 42 and contacts 46 may be formed using a variety of known techniques and materials.

Through use of the present invention, the adverse impact of parasitic capacitance between the source/drain regions 42 and the bulk substrate 30A may be reduced or avoided as device dimensions continue to shrink. In the present invention this is accomplished by forming localized dielectric regions 45 in the bulk substrate 30A, wherein the regions 45 have a reduced dielectric constant as compared to the dielectric constant of the bulk substrate 30A. More particularly, in the depicted embodiment, the regions 45 are formed in the bulk substrate 30A in a self-aligned manner such that the regions 45 are positioned in the bulk substrate 30A beneath the area to be occupied by the source/drain regions 42 of the transistor 32.

The present invention is generally directed to a method of making an SOI semiconductor device having enhanced, self-aligned dielectric regions in the bulk silicon substrate. In one illustrative embodiment, the method comprises forming a gate electrode above an SOI substrate comprised of a bulk substrate, a buried insulation layer and an active layer, the gate electrode having a protective layer formed thereabove, and forming a plurality of dielectric regions in the bulk substrate after the gate electrode is formed, the dielectric regions being self-aligned with respect to the gate electrode, the dielectric regions having a dielectric constant that is less than a dielectric constant of the bulk substrate. In a further embodiment, the method comprises forming a gate electrode above an SOI substrate comprised of a bulk substrate, a buried insulation layer and an active layer, the gate electrode having a protective layer formed thereabove, performing at least one oxygen implant process after the gate electrode and the protective layer are formed to introduce oxygen atoms into the bulk substrate to thereby form a plurality of oxygen-doped regions in the bulk substrate, and performing at least one anneal process to convert the oxygen-doped regions to dielectric regions comprised of silicon dioxide in the bulk substrate.

In one illustrative embodiment, the device comprises a gate electrode formed above an SOI structure comprised of a bulk substrate, a buried insulation layer, and an active layer, and a plurality of dielectric regions formed in the bulk substrate, the dielectric regions being self-aligned with respect to the gate electrode and having a dielectric constant that is less than that of the bulk substrate. In further embodiments, the dielectric regions are comprised of silicon dioxide.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed is:

1. A semiconductor device, comprising:
   a gate electrode formed above an SOI structure comprised of a bulk substrate, a buried insulation layer formed above the bulk substrate, and an active layer formed above the buried insulation layer; and
   a plurality of dielectric regions formed in said bulk substrate, said dielectric regions being self-aligned with respect to said gate electrode, said dielectric regions having a dielectric constant that is less than a dielectric constant of said bulk substrate.

2. The device of claim 1, wherein said gate electrode is comprised of at least one of polysilicon and a metal.

3. The device of claim 1, wherein said dielectric regions are comprised of silicon dioxide.

4. The device of claim 1, wherein said buried insulation layer is comprised of silicon dioxide.

5. The device of claim 1, wherein said active layer is comprised of silicon.

6. The device of claim 1, wherein said dielectric regions have a depth beneath a surface of said bulk substrate that ranges from approximately 10-200 nm.

7. The device of claim 1, further comprising a protective layer positioned above said gate electrode, said protective layer being comprised of at least one of silicon dioxide, silicon oxynitride, an oxide, polyimide and an organic anti-reflective coating.

8. A semiconductor device, comprising:
   a gate electrode formed above an SOI structure comprised of a bulk substrate, a buried insulation layer formed above the bulk substrate, and an active layer formed above the buried insulation layer; and
   a plurality of dielectric regions comprised of silicon dioxide formed in said bulk substrate, said dielectric regions being self-aligned with respect to said gate electrode.

9. The device of claim 8, wherein said gate electrode is comprised of at least one of polysilicon and a metal.

10. The device of claim 8, wherein said buried insulation layer is comprised of silicon dioxide.

11. The device of claim 8, wherein said active layer is comprised of silicon.

12. The device of claim 8, wherein said dielectric regions have a depth beneath a surface of said bulk substrate that ranges from approximately 10-200 nm.

13. The device of claim 8, further comprising a protective layer positioned above said gate electrode, said protective layer being comprised of at least one of silicon dioxide, silicon oxynitride, an oxide, polyimide and an organic anti-reflective coating.

* * * * *